(12) United States Patent
Lai et al.

(10) Patent No.: US 8,847,318 B2
(45) Date of Patent: *Sep. 30, 2014

(54) ESD PROTECTION CIRCUIT

(71) Applicant: GLOBALFOUNDRIES Singapore Pte. Ltd., Singapore (SG)

(72) Inventors: Da-Wei Lai, Singapore (SG); Handoko Linewih, Singapore (SG); Ying-Chang Lin, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 1 day.

This patent is subject to a terminal disclaimer.

(21) Appl. No.: 13/803,091

(22) Filed: Mar. 14, 2013

(65) Prior Publication Data

US 2013/0207179 A1 Aug. 15, 2013

Related U.S. Application Data

(63) Continuation-in-part of application No. 13/669,409, filed on Nov. 5, 2012.

(60) Provisional application No. 61/588,186, filed on Jan. 19, 2012.

(51) Int. Cl.
*H01L 23/62* (2006.01)
*H01L 29/66* (2006.01)
*H01L 27/02* (2006.01)

(52) U.S. Cl.
CPC .......... *H01L 27/0266* (2013.01); *H01L 27/027* (2013.01)
USPC ................... 257/355; 257/328; 257/E29.256; 257/E29.257; 257/E21.418; 257/E29.015

(58) Field of Classification Search
CPC . H01L 29/78; H01L 29/7833; H01L 29/7835; H01L 29/73; H01L 29/0847; H01L 29/0692; H01L 29/1045; H01L 29/1087; H01L 29/41758; H01L 29/4238; H01L 29/4933; H01L 29/665; H01L 27/0266; H01L 27/0251; H01L 27/0277; H01L 27/02
USPC .................. 257/328, 329, 335, 355, E29.256, 257/E29.257, E21.418, E21.435, E29.015
See application file for complete search history.

(56) References Cited

U.S. PATENT DOCUMENTS

| | | | | |
|---|---|---|---|---|
| 2005/0285200 | A1* | 12/2005 | Kim | 257/360 |
| 2010/0019318 | A1* | 1/2010 | Chao et al. | 257/336 |
| 2010/0171149 | A1* | 7/2010 | Denison et al. | 257/173 |
| 2012/0032270 | A1* | 2/2012 | Okumura et al. | 257/368 |

* cited by examiner

*Primary Examiner* — W. Wendy Kuo
*Assistant Examiner* — Moazzam Hossain
(74) *Attorney, Agent, or Firm* — Horizon IP Pte. Ltd.

(57) ABSTRACT

A device which includes a substrate defined with a device region with an ESD protection circuit having at least first and second transistors is disclosed. Each of the transistors includes a gate having first and second sides, a first diffusion region in the device region adjacent to the first side of the gate, a second diffusion region in the device region displaced away from the second side of the gate, and a drift isolation region disposed between the gate and the second diffusion region. A first device well encompasses the device region and a second device well is disposed within the first device well. The device also includes a drift well which encompasses the second diffusion region. Edges of the drift well do not extend below the gate and is away from a channel region. A drain well is disposed under the second diffusion region and within the drift well.

18 Claims, 2 Drawing Sheets

ESD PROTECTION CIRCUIT

BACKGROUND

Integrated circuits (ICs) can be damaged by electrostatic discharge (ESD). For example, ESD can damage a gate oxide of a transistor. To protect the transistor from damage, an ESD protection circuit is used to dissipate ESD current through the substrate of the IC. When a static discharge is detected at a pad of an IC, the ESD circuit is activated to dissipate current through the substrate, protecting the gate oxide.

Various types of ESD protection circuit have been used. One type of ESD protection circuit is a lateral diffused metal oxide semiconductor (LDMOS) transistor. The thermal runaway current (e.g., $It_2$) which relates to the ESD performance of the LDMOS is directly related to its total width. For example, the larger the total width of LDMOS transistor, the higher the $It_2$. However, conventional LDMOS transistors exhibit non-uniformity of the relationship between width and $It_2$. For example, increasing the total width of a LDMOS transistor does not result in the expected increase in $It_2$. In some instances, increasing the total width of the LDMOS transistor results in a decrease in $It_2$. Such non-uniformity negatively impacts ESD design rules, making it difficult for IC designers to provide the necessary ESD protection.

The disclosure is directed to provide improved uniformity in LDMOS transistors.

SUMMARY

Embodiments generally relate to semiconductor devices. In one embodiment, a device is presented. The device includes a substrate defined with a device region having an ESD protection circuit. The ESD protection circuit includes at least first and second transistors. Each of the transistors includes a gate having first and second sides, a first diffusion region in the device region adjacent to the first side of the gate, a second diffusion region in the device region displaced away from the second side of the gate, wherein the first and second diffusion regions comprise dopants of a first polarity type, and a drift isolation region disposed between the gate and the second diffusion region. The device includes a first device well encompasses the device region and a second device well disposed within the first device well. The device also includes a drift well which encompasses the second diffusion region. Edges of the drift well do not extend below the gate and is away from a channel region. A drain well having dopants of the first polarity type which is disposed under the second diffusion region and within the first device well.

In another embodiment, a device is disclosed. The device includes a substrate defined with a device region. The device region includes an ESD protection circuit having at least first and second transistors. Each of the transistors includes a gate having first and second sides, a first diffusion region in the device region adjacent to the first side of the gate, a second diffusion region in the device region displaced away from the second side of the gate, and a drift isolation region disposed between the gate and the second diffusion region. The device includes a first device well encompasses the device region and a second device well disposed within the first device well. The device also includes a drift well which encompasses the second diffusion region. Edges of the drift well do not extend below the gate and is away from a channel region. A drain well is disposed under the second diffusion region and within the drift well.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relate to semiconductor devices. ESD circuits are provided for the devices. For example, the ESD circuits may be used in high voltage applications or devices. ESD circuits, for example, are activated during an ESD event to dissipate ESD current. The devices, for example, may be any type of semiconductor devices, such as integrated circuits (ICs). Such devices, for example, can be incorporated into standalone devices or ICs, such as microcontrollers or system on chips (SoCs). The devices or ICs can be incorporated into or used with, for example, electronic products, such as speakers, computers, cell phones, and personal digital assistants (PDAs).

Figure 1:
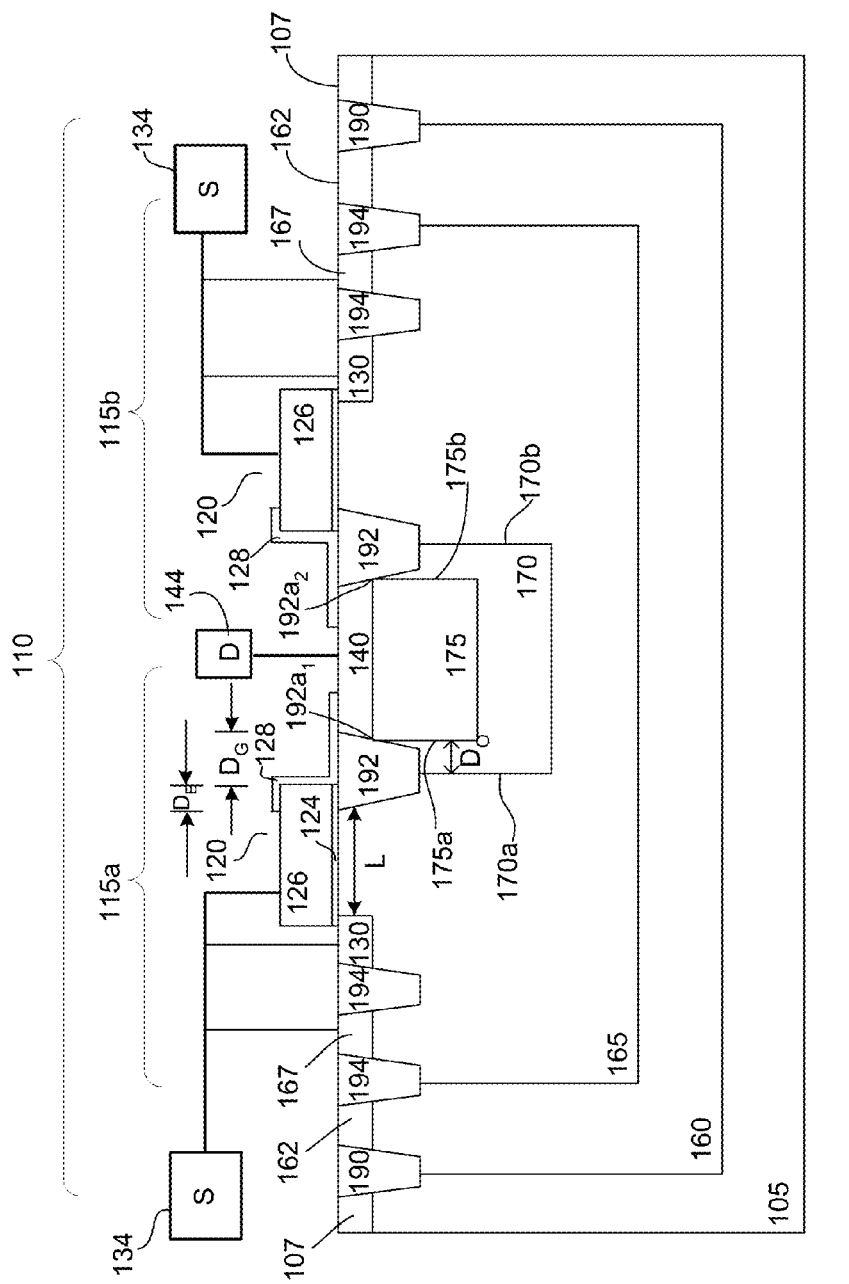
FIG. 1 shows cross-sectional view of an embodiment of a device.

FIG. 1 shows a cross-sectional view of an embodiment of a device 100. As shown, a substrate 105 is provided. The substrate, for example, is a semiconductor substrate, such as a silicon substrate. In one embodiment, the substrate may be a p-type doped substrate. For example, the p-type doped substrate is a lightly p-type doped substrate. Other types of semiconductor substrates, including doped with other types of dopants or concentration or undoped, may also be useful. For example, the substrate may be a silicon germanium, germanium, gallium arsenide, or crystal-on-insulator (COI) such as silicon-on-insulator (SOI). The substrate can be a doped substrate.

The device may include doped regions or wells having different dopant concentrations. For example, the device may include heavily doped, intermediate doped and lightly doped regions. The doped regions may be designated by $x^-$, $x$ and $x^+$, where x indicates the polarity of the doping, such as p for p-type or n for n-type, and:

$x^-$=lightly doped;
x=intermediately doped; and
$x^+$=heavily doped.

A lightly doped region may have a dopant concentration of less than about $5E13/cm^3$. For example, a lightly doped region may have a dopant concentration of about $1E11/cm^3$-$5E13/cm^3$. An intermediate doped region may have a dopant concentration from about $5E13$-$5E15/cm^3$. For a heavily doped region, it may have a dopant concentration of more than about $5E15/cm^3$. For example, a heavily doped region may have a dopant concentration from about $5E15\,cm^3$-$9E15/cm^3$. Other concentrations of the different types of doped regions may also be useful. P-type dopants may include boron (B), aluminum (Al), indium (In) or a combination thereof, while n-type dopants may include phosphorus (P), arsenic (As), antimony (Sb) or a combination thereof.

As shown, the device includes a device region 110 defined on the substrate. A device isolation region 190 may be provided for isolating or separating the device region from other device regions on the substrate. In one embodiment, the device isolation region surrounds the device region. The isolation region, for example, is a shallow trench isolation (STI) region. Other types of isolation regions may also be employed. For example, the isolation region may be a deep trench isolation (DTI) region. The isolation region, for example, extends to a depth of about 4000 Å for a STI region. Providing isolation regions which extend to other depths, such as 0.5-10 μm for DTI regions, may also be useful. In one embodiment, the width of the isolation region is about 0.3 μm. Providing isolation regions having different depths and widths may also be useful. The dimensions, for example, may depend on isolation requirements.

The device region includes an ESD protection circuit 115. The ESD protection circuit includes a plurality of LD transistors coupled in parallel. For example, the ESD protection circuit includes n LD transistors. As shown, the device region includes first and second (e.g., n=2) LD transistors 115a-b. Providing other number of LD transistors may also be useful.

A first doped well 160 is disposed in the substrate in the device region. The first doped well, as shown, encompasses the complete device region. For example, the first doped well serves as an isolation well. The first well includes first polarity type dopants. In one embodiment, the first well is lightly doped with first polarity type dopants. Providing a first well having other dopant concentrations may also be useful.

Each of the transistors includes a gate 120 which is disposed on the surface of the substrate in the device region. A gate may be referred to as a finger. The gate includes a gate electrode 126 disposed over a gate dielectric 124. In one embodiment, the gate electrode is a polysilicon gate electrode. Other suitable types of gate electrode materials may also be useful. As for the gate dielectric, it includes a silicon oxide. Other suitable types of gate dielectric materials may also be useful. In one embodiment, the gate is similar to gates used for high voltage devices. For example, the thicknesses of the gate electrode and gate dielectric may be similar to that of the high voltage devices. Other configurations of gates may also be useful.

The gate may be a gate conductor which forms gates of multiple transistors. For example, the gate conductor may traverse a plurality of device regions separated by isolation regions. The pluralities of transistors have a common gate formed by the gate conductor. Other configurations of gate conductors may also be useful.

The gate is disposed between first and second source/drain (S/D) regions 130 and 140. The S/D regions are first polarity type doped regions disposed in the substrate. The S/D regions are, for example, heavily doped first polarity type regions. For example, the S/D regions may have a depth of about 0.1-0.4 μm. Other suitable depths may also be useful. The S/D regions may be similar to those of other transistors of the device. In one embodiment, the first S/D region 130 is a source region and the second S/D region 140 is a drain region of the transistor.

The first S/D region is disposed adjacent to a first side of the gate. In one embodiment, the gate overlaps the first S/D region. For example, the first side of the gate overlaps the first S/D region. The amount of overlap should be sufficient for the first S/D region to be in communication with a channel of the transistor under the gate. The amount of overlap is, for example, about 0.1-0.5 μm. Overlapping the first S/D region by other amounts may also be useful. In one embodiment, the gate overlaps a lightly doped (LD) region of the first S/D region. Other configurations of the first S/D region may also be useful. As for the second S/D region 140, it is displaced by a distance $D_G$ laterally away from a second side of the gate. The lateral displacement $D_G$ may, in some instances, correspond to the drift distance. $D_G$, for example, may include any suitable distances which depend on general design rules of respective foundries.

In one embodiment, a drift isolation region 192 is provided between the gate and the second S/D region. The drift isolation region, for example, is a STI. Other types of drift isolation region may also be useful. As shown, the gate overlaps the drift isolation. The drift isolation region can be employed to increase the effective drift distance to be greater than $D_G$. For example, the drift distance can be increased to be equal to the profile of the drift isolation region. The distance L between the source region and drift isolation region correspond to a channel of the transistor. The effective drift distance is from the second S/D region, around the drift isolation region and to the channel under the gate.

In one embodiment, the second side of the gate is provided with a silicide block 128. The silicide block prevents formation of silicide to reduce risk of shorting of the silicide contact (not shown) on the drain region from shorting with the gate. The silicide block is a dielectric liner. For example, the dielectric liner is a silicon oxide liner. In one embodiment, the silicide block is disposed on the second side of the gate, overlapping the gate by a distance $D_E$. The distance $D_E$, for example, is equal to about 0.06 μm. $D_E$, for example, may also include any suitable distances which depend on general design rules of respective foundries. Providing a portion of the silicide block which overlaps the gate by a distance $D_E$ is advantageous as it effectively prevents formation of silicide in the underlying region and effectively prevents current to flow in the horizontal direction, leading to better ESD performance. The silicide block lines the top of the drift isolation region. As shown, the silicide block extends partially over the drain region.

As shown, the first and second LD transistors are configured to have a common second S/D or drain region. Other configurations of the LD transistors may also be useful.

A second well 165 is disposed in the substrate. The second well may be disposed in the device region. For example, the second well is disposed within the first well. The second well serves as a body well for the transistors. The second device well includes second polarity dopants for a first polarity type device. For example, the second device well includes p-type dopants for an n-type device or n-type dopants for a p-type device. The second device well may be lightly (x) or intermediately (x) doped with first polarity type dopants. Other dopant concentration for the second device well may also be useful.

The body well at least encompasses the first S/D regions and a part of the gates. As shown, the body well encompasses the first and second S/D regions. Other configurations of the second well may also be useful. A depth of the second well is shallower than the first well. Providing the second well with other depths may also be useful.

The substrate and the first and second wells, in one embodiment, are provided with substrate contacts 107, first and second well contacts 162 and 167 respectively for biasing the substrate and wells. The substrate contacts and well contacts are heavily doped regions, similar to the S/D regions. For example, a depth of the substrate contact or well contact is shallower than a depth of the device isolation region and the substrate contacts and well contacts are in communication with the respective substrate and wells. The dopant concentration of the substrate contacts and well contacts may be about 5E15 cm$^3$-9E15/cm$^3$. Other suitable concentration ranges may also be useful. The substrate contacts and well contacts have the same polarity type as the respective substrate and wells. For example, the first well contacts 162 are first polarity type doped regions and the second well contacts 167 are second polarity type doped regions.

In one embodiment, isolation regions 194 may be provided to separate the contact regions. The isolation regions may be STI regions. For example, the isolation regions may be similar to the device isolation regions. Other types or configurations of isolation regions may also be useful.

Metal silicide contacts (not shown) may be formed on the gate electrode and various contact regions. For example, metal silicide contacts may be provided over the S/D regions, well contacts and gate electrode. The silicide contacts, for example, may be nickel-based contacts. Other types of metal silicide contacts may also be useful. For example, the silicide contacts may be cobalt silicide (CoSi) contacts. The silicide contacts may be about 100-500 Å thick. Other thickness of silicide contacts may also be useful. The silicide contacts may be employed to reduce contact resistance and facilitate contact to the back-end-of-line metal interconnects.

In one embodiment, a third well 170 is provided. The third well is disposed in the substrate within the second well. For example, a depth of the third well is shallower than a depth of the second well. The third well serves as a drift well. In one embodiment, the drift well encompasses the second S/D region and is configured or narrowed so that the edge of the drift well does not extend below the gate and is away from the channel region.

In one embodiment, the depth or bottom of the third well is below the isolation regions. The depth of the third well may be about 0.1-5 μm. Other depths may also be useful. The depth, for example, may depend on the design voltage of the device. The drift well, for example, extends from a bottom of the device isolation region 192 under a first gate to a bottom of the device isolation region 192 under the second gate. The width of the third well, for example, extends from the first edge 170a to the second edge 170b of the third well. The width of the third well, for example, is about 8 μm. The third well may also include other suitable width dimensions.

The drift well includes first polarity type dopants. In one embodiment, the dopant concentration of the drift well is lower than the dopant concentration of the drain. In one embodiment, the drift well may be lightly (x) or intermediately (x) doped with first polarity type dopants. For example, the dopant concentration of the drift well is about 1E12-1E14/cm$^2$. Other suitable dopant concentrations may also be useful. For example, the dopant concentration may depend on the maximum or breakdown voltage requirement of the device.

In one embodiment, the second well, the first S/D region and gate are commonly coupled to a first terminal 134 of the ESD device. The second S/D region is coupled to a second terminal 144 of the ESD device. For example, the first terminal is a source terminal and the second terminal is a drain terminal. In one embodiment, the second well contact 167 is also coupled to the first or source terminal. The source terminal, for example, is coupled to ground while the drain terminal, for example, is coupled to $V_{DD}$ or I/O pad. Other configurations of terminal connections to the ESD devices may also be useful.

In one embodiment, a fourth well 175 is provided. The fourth well, for example, serves as a second S/D or drain well. The drain well is disposed in the substrate. In one embodiment, the drain well is disposed within the third well and is contiguous with the drain region. For example, the drain well overlaps into the drain region. In one embodiment, the first edge 175a of the drain well is aligned with or contacts an edge 192a$_1$ of the drift isolation region of the first transistor which is away from the gate of the first transistor. Similarly, the second edge 175b of the drain well is aligned with or contacts an edge 192a$_2$ of the drift isolation region of the second transistor which is away from the gate of the second transistor. A depth of the fourth well is shallower than a depth of the third well. In one embodiment, the width of the second diffusion or drain region 140, in one embodiment, is the same as the width of the fourth well 175. In another embodiment, the width of the second diffusion or drain region 140 may be narrower than the width of the fourth well 175. Providing a second diffusion or drain region 140 which is narrower than the width of the fourth well 175 or which is displaced away from the drift isolation region 192 is advantageous as it increases the resistance for current to flow in the horizontal direction towards the channel region. This leads to more uniform turn on of the ESD device, resulting in better ESD performance. The drain well includes first polarity type dopants. In one embodiment, the dopant concentration of the drain well is between the second S/D region and drift well. In one embodiment, the drain well may be intermediately (x) doped with first polarity type dopants. Other suitable dopant concentrations may also be useful.

As described, the drift well 170 encompasses the second S/D region 140 and is configured or narrowed so that the edge 170a or 170b of the drift well does not extend below the gate and is away from the channel region. In one embodiment, the fourth or drain well 175 is narrower than the third or drift well 170. For example, the first edge 170a of the drift well is below and aligned with about the center of the drift isolation region 192 of the first transistor and the second edge 170b is below and aligned with about the center of another drift isolation region 192 of the second transistor. At least edges of the third and fourth well adjacent to the gate, for example, are separated by a distance. As shown in FIG. 1, the first edge 170a of the third well and the first edge 175a of the fourth well are separated by a distance $D_O$. The second edge 170b of the third well, for example, is separated from the second edge 175b of the fourth well by the same distance $D_O$. In another embodiment, the first edge 170a of the drift well is aligned with the first edge 175a of the fourth well while the second edge 170b of the drift well is aligned with the second edge 175b of the fourth well. The distance $D_O$, for example, is about 1.0 μm or less with reference to the edge 175a or 175b of the fourth or drain well. The distance $D_O$, for example, may be tuned or varied with reference to the edge 175a or 175b of the fourth well 175. Other suitable distances for $D_O$ may also be useful, as long as the edge of the third well 170a or 170b is not too close to the channel region. This reduces or avoids the risk of negatively impacting the ESD performance of the device. For example, any suitable distances for $D_O$ may be useful, so long as the edge of the third well does not extend over the drift isolation region and towards the channel region.

We have discovered that providing the drift well and the drain well with the configuration as described above result in advantages. For example, such configuration increases the base of the parasitic bipolar transistor of the ESD circuit, which increases the holding voltage ($V_h$) of the ESD device. By narrowing the drift well as described above, the base push-out phenomenon is also depressed, resulting in improved uniform turn on of the ESD device. Moreover, we have also discovered that such configuration as described enhances uniform turn-on across the multiple fingers. As such, the ESD performance of such configuration as described with respect to FIG. 1 has been found to be directly proportional to the number of fingers.

Furthermore, providing a drain well under the drain has been found to create a lower resistance path in the vertical direction. As such, current is directed to flow in the vertical direction instead of in the horizontal direction. Thus, base push-out phenomenon is relaxed or depressed at an early stage. This results in improved and more uniform turn on of the ESD device.

Figure 2:
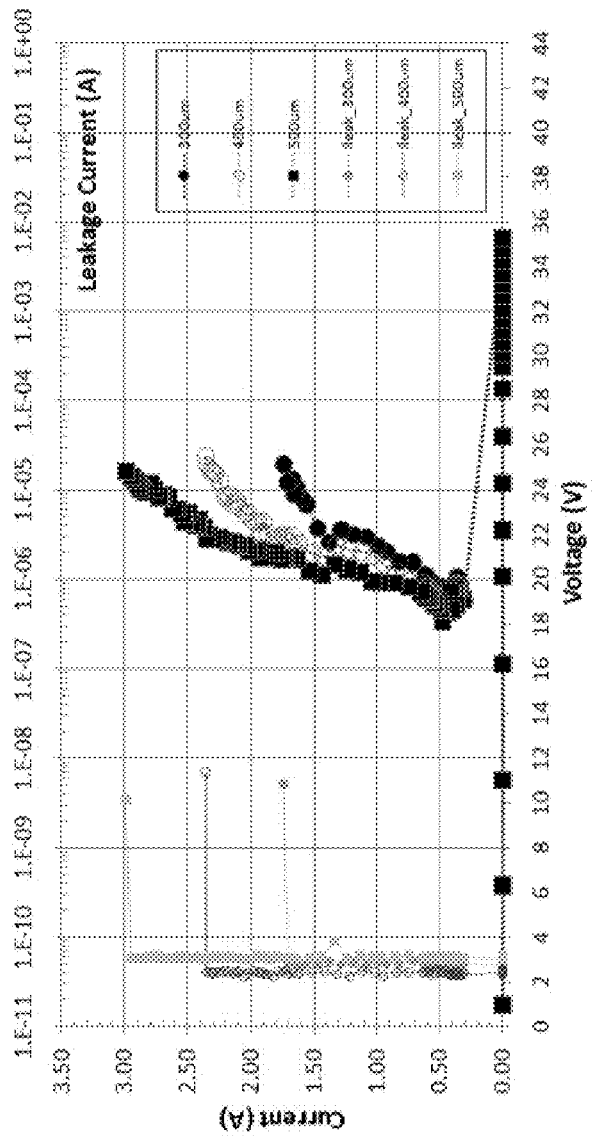
FIG. 2 shows a transmission line pulse (TLP measurement) of various devices.

FIG. 2 shows a table and a TLP measurement of the embodiment of the ESD protection circuit with multiple fingers. Referring to FIG. 2, lg refers to the channel length, $D_O$ refers to the separation distance between the edge of the fourth well and the edge of the third well, total width refers to the total gate width, FW refers to the finger width, DCGS refers to the drain to gate contact spacing, SCGS refers to the source contact to gate spacing while D_NW refers to the width of the drain well. These parameters, for example, are presented in µm. As discussed, the thermal runaway current ($It_2$) relates to the ESD performance of the LDMOS. As shown in FIG. 2, $It_2$ of the LDMOS devices based on the configuration described above increases with the total width. As such, $It_2$ is approximately proportional to its total width. This implies more uniform turn on of the ESD device. As such, the configuration as described above is effective to increase the ESD $It_2$ capability such that it is proportionate to the number of fingers in the ESD device. The increased in $It_2$ which correlates with the number of fingers means that the device is capable of shunting greater amount of current before failure. Accordingly, the ESD device based on the configuration above exhibits superior ESD performance.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

What is claimed is:

1. A device comprising:
    a substrate defined with a device region, the device region comprises an ESD protection circuit having at least first and second transistors, wherein each of the transistors includes
        a gate having first and second sides,
        a first diffusion region in the device region adjacent to the first side of the gate,
        a second diffusion region in the device region displaced away from the second side of the gate, the second diffusion region is disposed between adjacent second sides of the gates of the first and second transistors, wherein the first and second diffusion regions comprise dopants of a first polarity type, and
        a drift isolation region disposed between the gate and the second diffusion region;
    a first device well encompasses the device region;
    a drift well which encompasses the second diffusion region, wherein edges of the drift well do not extend below the second sides of the gates of the first and second transistors and is displaced away from channels of the transistors, the drift well comprises first polarity type dopants; and
    a drain well having dopants of the first polarity type is disposed under the second diffusion region and disposed completely within the drift well.

2. The device of claim 1 further comprising a second device well disposed within the first device well, wherein the first device well comprises dopants of the first polarity type and the second device well comprises dopants of a second polarity type.

3. The device of claim 2 wherein the first polarity type comprises n type and the second polarity type comprises p type.

4. The device of claim 1 further comprising a second device well disposed within the first device well, wherein the second device well encompasses at least the first diffusion region and a part of the gate.

5. The device of claim 4 wherein the second device well encompasses the gate, the drift isolation region and the second diffusion region.

6. The device of claim 4 wherein the first device well and the drift well comprise dopants of the first polarity type and the second device well comprises dopants of a second polarity type.

7. The device of claim 6 wherein the first polarity type comprises n type and the second polarity type comprises p type.

8. The device of claim 1 wherein the drain well is narrower than the drift well.

9. The device of claim 1 wherein a first edge of the drift well is below the center of the drift isolation region of the first transistor and a second edge of the drift well is below the center of the drift isolation region of the second transistor.

10. The device of claim 9 wherein the drain well is contiguous with the second diffusion region.

11. The device of claim 10 wherein a separation distance between a first edge of the drain well and the first edge of the drift well is the same as a separation distance between a second edge of the drain well and the second edge of the drift well.

12. A device comprising:
    a substrate defined with a device region, the device region comprises an ESD protection circuit having at least first and second transistors, wherein each of the transistors includes
        a gate having first and second sides,
        a first diffusion region in the device region adjacent to the first side of the gate,
        a second diffusion region in the device region displaced away from the second side of the gate, the second diffusion region is disposed between adjacent second sides of the gates of the first and second transistors, and
        a drift isolation region disposed between the gate and the second diffusion region;
    a first device well encompasses the device region;
    a drift well which encompasses the second diffusion region, wherein edges of the drift well do not extend below the second sides of the gates of the first and second transistors and is displaced away from channels of the transistors, the drift well comprises first polarity type dopants; and
    a drain well disposed under the second diffusion region and disposed completely within the drift well.

13. The device of claim 12 wherein:
    the first device well comprises dopants of a first polarity type; and
    the first and second diffusion regions comprise dopants of the first polarity type.

14. The device of claim 13 wherein the first polarity type comprises n type and the second polarity type comprises p type.

15. The device of claim 12 wherein a first edge of the drift well is below the center of the drift isolation region of the first transistor and a second edge of the drift well is below the center of the drift isolation region of the second transistor.

16. The device of claim 15 wherein the drain well is contiguous with the second diffusion region.

17. The device of claim 16 wherein a first edge 175*a* of the drain well is aligned with an edge of the drift isolation region of the first transistor which is away from the gate of the first transistor and a second edge 175*b* of the drain well is aligned with an edge of the drift isolation region of the second transistor which is away from the gate of the second transistor.

18. The device of claim 17 wherein a separation distance between the first edge of the drain well and the first edge of the drift well is the same as a separation distance between the second edge of the drain well and the second edge of the drift well.

\* \* \* \* \*